United States Patent [19]
Lee

[11] Patent Number: 5,585,759
[45] Date of Patent: Dec. 17, 1996

[54] INPUT BUFFER OF SEMICONDUCTOR INTEGRATED CIRCUIT

[75] Inventor: Jin-Young Lee, Seoul, Rep. of Korea

[73] Assignee: Samsung Electronics Co., Ltd., Suwon, Rep. of Korea

[21] Appl. No.: 518,386

[22] Filed: Aug. 15, 1995

[30] Foreign Application Priority Data

Aug. 17, 1994 [KR]   Rep. of Korea ..................... 20279/94

[51] Int. Cl.⁶ ........................... H01H 37/76; H03K 17/62
[52] U.S. Cl. ........................................... 327/525; 327/404
[58] Field of Search ............................ 327/525, 403–413

[56] References Cited

U.S. PATENT DOCUMENTS 4,608,530  8/1986  Bacrania .................................. 327/525
5,428,311  6/1995  McClure .................................. 327/525

FOREIGN PATENT DOCUMENTS 52-41850   3/1977  Japan ..................................... 327/525
1-278746  11/1989  Japan ..................................... 327/525

Primary Examiner—Toan Tran
Attorney, Agent, or Firm—Cushman Darby & Cushman, L.L.P.

[57] ABSTRACT

The present invention provides non-cut fuses and/or conductive transmission gates to control signal flow, and cut fuses and non-conductive transmission gate paths to prevent cross-talk from occurring.

14 Claims, 3 Drawing Sheets

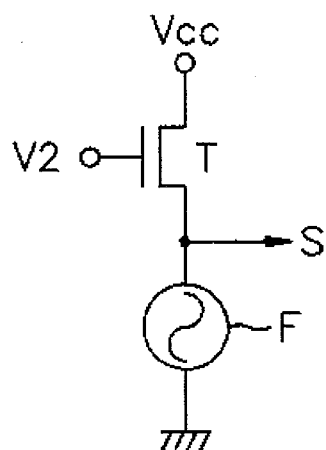
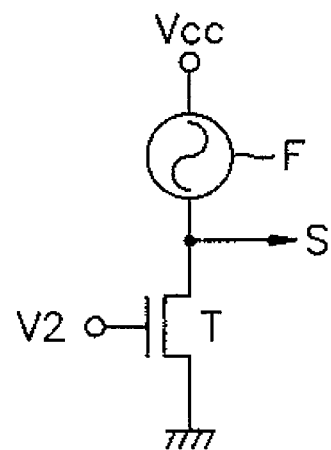
*FIG. 3*                *FIG. 4*
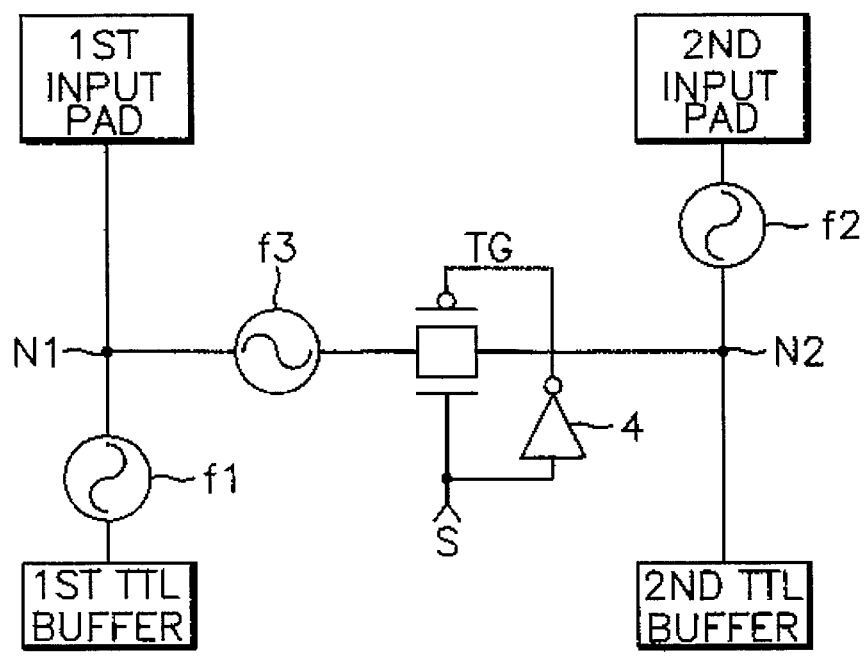
*FIG. 5*

5,585,759

INPUT BUFFER OF SEMICONDUCTOR INTEGRATED CIRCUIT

BACKGROUND OF THE INVENTION

The present invention relates to a semiconductor integrated circuit, and, more particularly, to an input buffer of a semiconductor integrated circuit capable of performing various operation modes on-chip.

Generally, in existing semiconductor integrated circuits, various operation modes are installed within on-chip in order to freely perform specific operation modes, at the request of a user. With such circuits, input pads identical to each other are moved according to an arrangement of a pin for performing respective operation mode so that a plurality of input pads used in the respective operation mode are provided and wire-bonded in accordance with arrangement of the pin.

When the various operation modes are installed within a single chip in a prior art input buffer, several input pads corresponding to the operation modes are required. As a result, the size of chip is enlarged in proportion to the increased number of input pads, which decreases the number of net die. This results in a problem that the product manufacturing efficiency is lowered. To solve this problem, however, the optional-connection of a fuse between a single input pad and an input pad adjacent thereto and by an adaptive usage of the single input pad to the pin corresponding to the operation mode has been proposed so that a problem caused due to arrangement of pins can be removed without increasing the number of input pads.

FIG. 1 is a circuit diagram illustrating a conventional input buffer. An input buffer of FIG. 1 is composed of an NMOS transistor 2, a first fuse f1, a second fuse f2, a third fuse f3 and an NMOS transmission transistor TG. The NMOS transistor 2 is connected between a power supply voltage Vcc and a control node N, and to a control voltage V1 at its gate terminal. The first fuse f1 is connected between the control node N and ground voltage terminal, the second fuse f2 between a first input pad and a first TTL buffer (transistor—transistor logic buffer), and the third fuse f3 between a second input pad and a second TTL buffer. The NMOS transmission transistor TG is connected between the first input pad and the second fuse f2 at its drain terminal, and to the control node N at its gate terminal, and between the third fuse f3 and the second TTL buffer at its source terminal.

In the input buffer shown in FIG. 1, a state of the control node N, which controls the gate terminal of NMOS transmission transistor TG, depends on a state of the first fuse f1. When the level of control voltage V1 rises to a fully logic "high" state, if the first fuse f1 is cut off, the NMOS transistor 2 is turned ON to thereby turn ON the NMOS transmission transistor TG, and thus an output of the first input pad is transmitted to the first TTL buffer or/and the second TTL buffer according to the states of the second and third fuses f2 and f3. If the first fuse f1 is not cut off, the NMOS transmission transistor TG is turned OFF. Thus, the output of the first input pad is supplied as an input of the first TTL buffer and an output of the second input pad is supplied as an input of the second TTL buffer.

On the other hand, if the outputs of the first and second input pads have a level of −2 V or so, respectively, a gate-source voltage Vgs of the NMOS transmission transistor TG becomes increased, thereby causing the NMOS transmission transistor TG to be changed from turned-off state to a turned-on state. In this case, a cross-talk between the first input pad and the second input pad is generated, such that the first and the second TTL buffers operate incorrectly.

As shown in FIG. 1, the transmission gate has been used for modifying paths of the input pads and the TTL buffer, but in this case, a noise is generated due to the cross-talking between input pads according to an on/off operation of the transmission gate, and therefore unexpected malfunction of the chip may occur.

SUMMARY OF THE INVENTION

It is an object of the present invention to provide an input buffer which is capable of suppressing noise by cutting off a path of cross-talk between each input pad resulting from arrangement of a plurality of input pads.

It is another object of the present invention to provide an input buffer which is capable of preventing a chip malfunction by providing additional fuses therein and by thus cutting off a path of cross-talk between each input pad in accordance with an on/off operation of a transmission gate.

The present invention accomplishes the above objects, among others by providing non-cut fuses and/or conductive transmission gates to control signal flow, and cut fuses and non-conductive transmission gate paths to prevent cross-talk from occurring.

BRIEF DESCRIPTION OF THE DRAWINGS

A more complete appreciation of the invention, and many of the attendant advantages thereof, will be readily apparent as the same becomes better understood by reference to the following detail description when considered in conjunction with the accompanying drawings in which like reference symbols indicate the same or similar components, wherein:

FIGS. 3 and 4 are circuit diagrams illustrating the embodiments of control signal generating circuit of FIG. 2;

FIG. 5 is a circuit diagram illustrating an input buffer constructed according to a second embodiment of the present invention;

DETAILED DESCRIPTION OF THE PREFERRED EMBODIMENT

Figure 1:
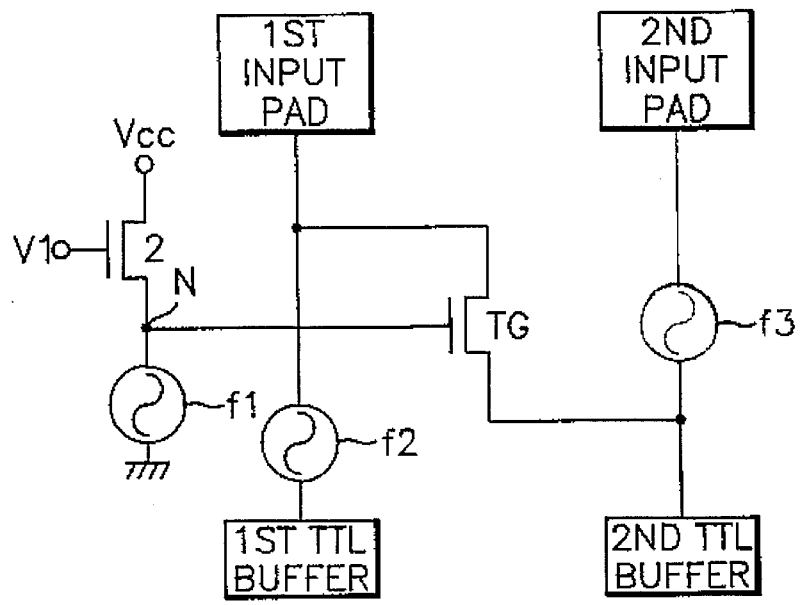
FIG. 1 is a circuit diagram illustrating a conventional input buffer.
Figure 2:
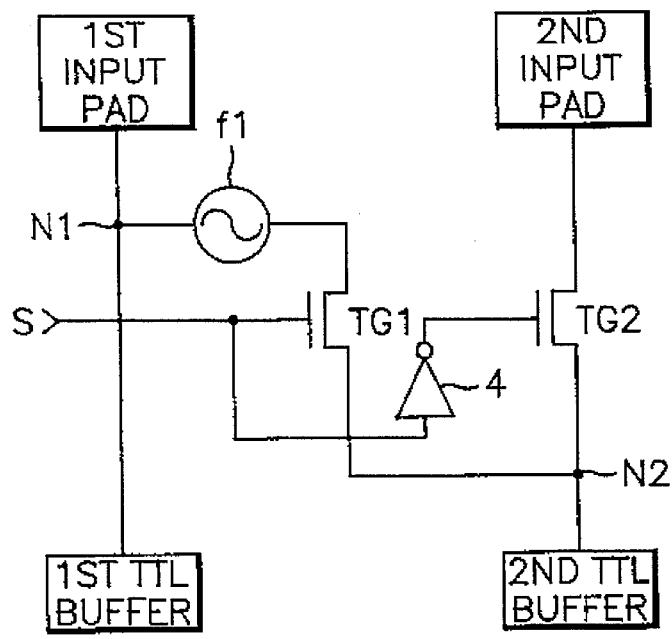
FIG. 2 is a circuit diagram illustrating an input buffer constructed according to a first embodiment of the present invention.

FIG. 2 is a circuit diagram illustrating an input buffer constructed according to a first embodiment of the present invention. An input buffer of the semiconductor integrated circuit having first and second input pads, and first and second TTL buffers corresponding to each of the first and second input pads, includes a first node N1 coupled between the first input pad and the first TTL buffer, a second node N2 coupled between the second input pad and the second TTL buffer, a first fuse f1 associated with the first node N1 at its one terminal, a first transmission gate TG1 coupled between the other terminal of the first fuse f1 and the second node N2 and controlled at its gate terminal by a given control signal S, and a second transmission gate TG2 connected between the second input pad and the second node N2 and controlled at its gate terminal by an inverse control signal of control signal S, wherein the transmission gates TG1 and TG2 are composed of NMOS transistors.

FIG. 3 is a circuit diagram illustrating an embodiment of a control signal S generating circuit of FIG. 2. The control signal S generating circuit shown in FIG. 3 is composed of an NMOS transistor T connected between a power supply voltage Vcc and an output node S and controlled at its gate terminal by the control voltage V2, and a fuse F coupled between the output node S and ground potential. If the NMOS transistor T is turned ON as the level of control voltage V2 rises to a fully logic "high" state, the control signal S in the logic "high" or "low" state is outputted according to the cutting state of the fuse F. If the fuse F is cut, the control signal S in the logic "high" state is generated, and if the fuse F is not cut, the control signal S in the logic "low" slate is generated.

FIG. 4 is a circuit diagram illustrating another embodiment of the control signal S generating circuit of FIG. 2. A generating circuit shown in FIG. 4 is composed of the fuse F connected between the power supply voltage Vcc and the output node S, and the NMOS transistor T coupled between the output node S and the ground potential and associated with the control voltage V2 at its gate terminal. If the NMOS transistor T is turned ON as the level of control voltage V2 rises to a fully logic "high" state, the control signal S in the logic "low" or "high" state is outputted according to the cutting state of the fuse F. If the fuse F is cut, the control signal S in the logic "low" state is generated, and if the fuse F is not cut, the control signal S in the logic "high" state is generated.

When one of operation modes is selected, the control signal S is set to the logic "high" or "low" state to thereby control the input buffer shown in FIG. 2.

An operation of input buffer constructed according to the first embodiment of the present invention will be in detail described with reference to FIG. 2 to FIG. 4.

When the control signal S goes to the logic "high" state, the first transmission gate TG1 is turned ON and the second transmission gate TG2 is turned OFF. An output of input pad can be transmitted to each of the first and second TTL buffers, while maintaining the state of the first fuse f1.

In contrast, when the control signal S goes to the logic "low" state, the first transmission gate TG1 is turned OFF and the second transmission gate TG2 is turned ON. As the first fuse f1 is cut, the outputs of the first and second input pads can be respectively transmitted to the first and second TTL buffers.

Accordingly, the first and second input pads can be selectively connected to the first and second TTL buffers by selectively cutting the first fuse f1 according to the state of control signal S, so that cross-talk phenomenon caused by the state of input pads can be prevented, occurrence of noise reduced, and a malfunction of chip avoided.

FIG. 5 is a circuit diagram illustrating an input buffer constructed according to a second embodiment of the present invention. An input buffer of the semiconductor integrated circuit having first and second input pads, and first and second TTL buffers corresponding to the first and second input pads, respectively, as shown in FIG. 5, includes a first node N1 coupled between the first input pad and the first TTL buffer, a second node N2 coupled between the second input pad and the second TTL buffer, a first fuse f1 coupled between the first node N1 and the first TTL buffer, a fuse f2 coupled between the second input pad and the second node N2, a third fuse f3 associated with the first node N1 at its one terminal, and a transmission gate TG coupled between the other terminal of the third fuse f3 and the second node N2 and respectively controlled at its gate terminal by a given control signal S and an inverse control signal thereof.

When the control signal S goes to the logic "high" state, the transmission gate TG is turned ON, and an output of the first input pad can be transmitted to each of the first and second TTL buffers, by cutting the second fuse f2, while not cutting the first fuse f1 and the third fuse f3. Alternatively, the output of the first input pad can be transmitted to the second TTL buffer by cutting the first fuse f1 and the second fuse f2, while not cutting the third fuse f3.

In contrast, when the control signal S goes to the logic "low" state, transmission gate TG is turned OFF, and the outputs of the first input pad and second input pad can be respectively transmitted to the first and second TTL buffers by cutting the third fuse f3, while not cutting the first fuse f1 and the second fuse f2.

Accordingly, the first and second input pads can be selectively connected to the first and second TTL buffers by selectively cutting the first to third fuses f1, f2 and f3 according to the state of control signal S, so that a cross-talking phenomenon caused by the state of input pads can be prevented, occurrence of noise reduced, and a malfunction of chip avoided.

Figure 6:
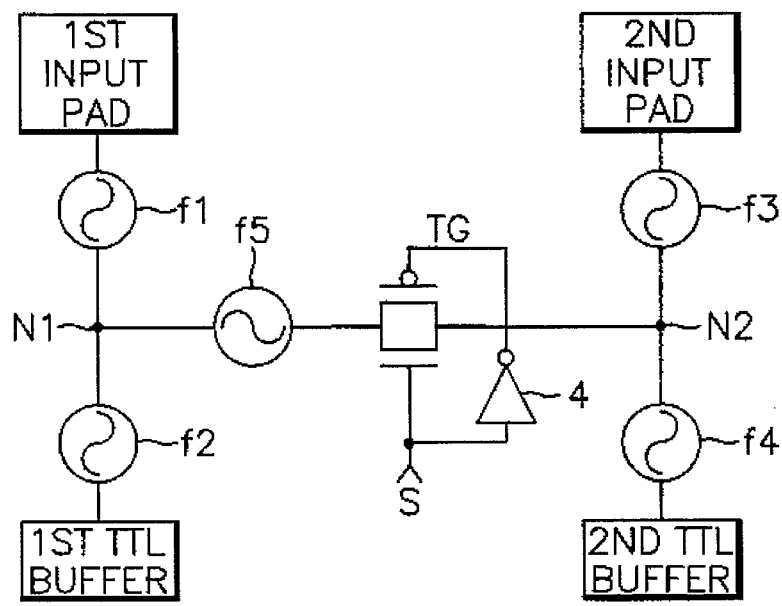
FIG. 6 is a circuit diagram illustrating an input buffer constructed according to a third embodiment of the present invention.

FIG. 6 is a circuit diagram illustrating an input buffer constructed according to a third embodiment of the present invention. An input buffer of the semiconductor integrated circuit having first and second input pads, and first and second TTL buffers corresponding to the first and second input pads, respectively, as shown in FIG. 6, includes a first node N1 coupled between the first input pad and the first TTL buffer, a second node N2 coupled between the second input pad and the second TTL buffer, a first fuse f1 coupled between the first input pad and the first node N1, a second fuse f2 coupled between the first node N1 and the first TTL buffer, a third fuse f3 coupled between the second input pad and the second node N2, a fourth fuse f4 coupled between the second node N2 and the second TTL buffer, a fifth fuse f5 coupled with the first node N1 at its one terminal, and a transmission gate TG connected between the other terminal of the fifth fuse f5 and the second node N2 and respectively controlled at its gate terminals by a given control signal S and an inverse control signal thereof.

When the control signal S goes to the logic "high" state, the transmission gate TG is turned ON, and an output of the first input pad can be transmitted to each of the first and second TTL input buffers, by cutting the third fuse f3, while not cutting the first, second, fourth and fifth fuses f1, f2, f4 and f5. The output of the first input pad can be transmitted to the second TTL buffer by cutting the second and third fuses f2 and f3, while not cutting the first, fourth, and fifth fuses f1, f4, and f5. An output of the second input pad can be transmitted to the first and second TTL buffers by cutting the first fuse f1, while not cutting the second through fifth fuses f2, f3, f4, and f5. And also, the output of the second input buffer can be transmitted to the first TTL buffer by cutting the first and fourth fuses f1 and f4, while not cutting the second, third, and fifth fuses f2, f3, and f5.

In contrast, when the control signal S goes to the logic "low" state, the outputs of the first and second input pads can be respectively transmitted to the first and second TTL buffers by cutting the fifth fuse f5, while not cutting the first through fourth fuses f1–f4.

Accordingly, the first and second input pads can be selectively connected to the first and second TTL buffers by selectively cutting the first to fifth fuses f1, f2, f3, f4, and f5 according to the state of the control signal S, so that cross-talk phenomenon caused by the state of input pads can be prevented, occurrence of noise reduced, and a malfunction of chip avoided.

Figure 7:
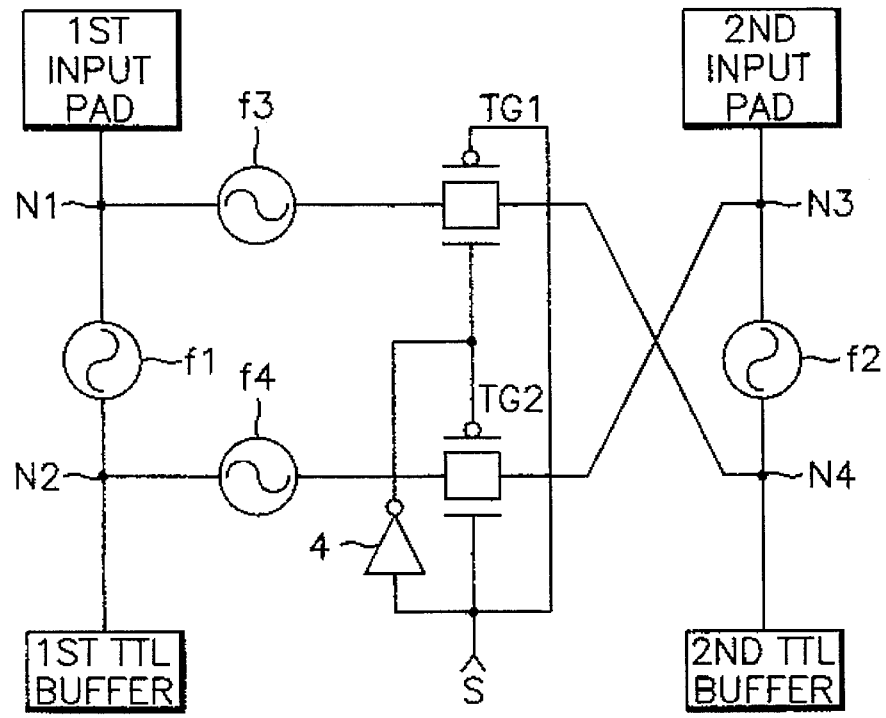
FIG. 7 is a circuit diagram illustrating an input buffer constructed according to a fourth embodiment of the present invention.

FIG. 7 is a circuit diagram illustrating an input buffer constructed according to a fourth embodiment of the present invention. An input buffer of the semiconductor integrated circuit having first and second input pads, and first and second TTL buffers corresponding to the first and second input pads, respectively, as shown in FIG. 7, includes first and second nodes N1 and N2 coupled between the first input pad and the first TTL buffer, third and fourth nodes N3 and N4 coupled between the second input pad and the second TTL buffer, a first fuse f1 coupled between the first node N1 and the second node N2, a second fuse f2 coupled between the third node N3 and the fourth node N4, a third fuse f3 coupled with the first node N1 at its one terminal, a fourth fuse f4 coupled with the second node N2 at its one terminal, a first transmission gate TG1 coupled between the other terminal of the third fuse f3 and the fourth node N4 and respectively controlled at its gate terminal by a given control signal S and an inverse control signal thereof, and a second transmission gate TG2 coupled between the other terminal of the fourth fuse f4 and the third node N3 and respectively controlled at its gate terminal by a given control signal S and an inverse control signal thereof.

When the control signal S goes to the logic "high" state, the transmission gates TG1 and TG2 are respectively turned ON. The outputs of the first and second input pads can be respectively transmitted to the second and first TTL buffers by cutting the first and second fuses f1 and f2, while not cutting the third and fourth fuses f3 and f4.

In contrast, when the control signal S goes to the logic "low" state, the transmission gates TG1 and TG2 are respectively turned OFF. The outputs of the first and second input pads can be respectively transmitted to the first and second TTL buffers by cutting the third and fourth fuses f3 and f4, while not cutting the first and second fuses f1 and f2.

Accordingly, the first and second input pads can be selectively connected to the first and second TTL buffers by selectively cutting the first to fourth fuses f1, f2, f3, and f4 in accordance with the state of the control signal S, so that cross-talk phenomenon caused by the state of input pads can be prevented, occurrence of noise reduced, and a malfunction of chip avoided.

As described above, an input buffer according to the present invention has advantages in that generation of path noise can be controlled by shielding paths of cross-talk between input pads that otherwise result from arranging a plurality of input pads, and also minimizes malfunctions of a chip by additionally providing fuses to thereby shield paths of cross-talk between input pads according to on/off operations of transmission gates.

While the invention has been described with reference to a few specific embodiments, the description is illustrating of the invention and is not to be constructed as limiting the invention. Various modifications may occur to those skilled in the art without departing from the spirit and scope of the invention as defined by the appended claims.

What is claimed is:

1. An input buffer of a semiconductor integrated circuit having at least first and second input pads, and first and second TTL buffers, in order to perform various operation modes within a chip, said input buffer comprising:
   a first conductive path coupled between said first input pad and said first TTL buffer that establishes a first node;
   a second conductive path coupled between said second TTL buffer and a second node;
   a fuse and a first transmission gate serially connected between said first node and said second node, said first transmission gate having a first gate terminal controlled by a control signal; and
   a second transmission gate connected between said second input pad and said second node, and having a second gate terminal controlled by an inverse of said control signal so that connections between said input pads and said TTL buffers can be selectively controlled according to a cut state of said fuse and operation states of said first and second transmission gates.

2. An input buffer of a semiconductor integrated circuit having at least first and second input pads, and first and second TTL buffers, in order to perform various operation modes within a chip, said input buffer comprising:
   a first node;
   a first conductive path coupled between said first input pad and said first node;
   a second node;
   a second conductive path coupled between said second TTL buffer and said second node;
   a first fuse coupled between said first node and said first TTL buffer;
   a second fuse coupled between said second input pad and said second node; and
   a third fuse and a transmission gate serially connected between said first node and said second node, said transmission gate having a gate terminal controlled by a control signal so that connections between said input pads and said TTL buffers can be selectively controlled according to cut states of said first, second and third fuses and an operation state of said transmission gate.

3. An input buffer of a semiconductor integrated circuit having at least first and second input pads, and first and second TTL buffers, in order to perform various operation modes within a chip, said input buffer comprising:
   a first node
   a second node
   a first fuse coupled between said first input pad and said first node;
   a second fuse coupled between said first node and said first TTL buffer;
   a third fuse coupled between said second input pad and said second node;
   a fourth fuse coupled between said second node and said second TTL buffer; and
   a fifth fuse and a transmission gate serially connected between said first node and said second node, said transmission gate having a gate terminal controlled by a control signal so that connections between said input pads and said TTL buffers are selectively controlled according to cut states of said first, second, third, fourth and fifth fuses and an operation state of said transmission gate.

4. An input buffer of a semiconductor integrated circuit having at least first and second input pads, and first and second TTL buffers, in order to perform various operation modes within a chip, said input buffer comprising:

- a first conductive path coupled between said first input pad and a first node;
- a second conductive path coupled between said first TTL buffer and a second node;
- a third conductive path coupled between said second input pad and a third node;
- a fourth conductive path coupled between said second TTL buffer and a fourth node;
- a first fuse coupled between said first and said second nodes;
- a second fuse coupled between said third and said fourth nodes;
- a third fuse and a first transmission gate serially coupled between said first node and said fourth node, said first transmission gate having a first gate terminal controlled by a control signal, and
- a fourth fuse and a second transmission gate serially coupled between said second node and said third node, said second transmission gate having a second gate terminal controlled by said control signal so that connections between said input pads and said TTL buffers are selectively controlled according to cut states of said first, second, third and fourth fuses and operation states of said first and second transmission gates.

5. An input buffer according to claim 1 wherein said first and second transmission gates are MOS transistors.

6. An input buffer according to claim 2 wherein said transmission gate is further controlled by an inverse of said control signal that is received at an inverse gate terminal of said transmission gate.

7. An input buffer according to claim 6 wherein said transmission gate includes at least one MOS transistor.

8. An input buffer according to claim 2 wherein said transmission gate is a MOS transistor.

9. An input buffer according to claim 3 wherein said transmission gate is further controlled by an inverse of said control signal that is received at an inverse gate terminal of said transmission gate.

10. An input buffer according to claim 9 wherein said transmission gate includes at least one MOS transistor.

11. An input buffer according to claim 3 wherein said transmission gate is a MOS transistor.

12. An input buffer according to claim 4 wherein each of said first and second transmission gates are further controlled by an inverse of said control signal that is received at an inverse gate terminal of each of said first and second transmission gates.

13. An input buffer according to claim 12 wherein each of said first and second transmission gates includes at least one MOS transistor.

14. An input buffer according to claim 4 wherein each of said first and second transmission gates is a MOS transistor.

* * * * *